United States Patent [19]

Quan

[11] Patent Number: 5,502,372
[45] Date of Patent: Mar. 26, 1996

[54] MICROSTRIP DIAGNOSTIC PROBE FOR THICK METAL FLARED NOTCH AND RIDGED WAVEGUIDE RADIATORS

[75] Inventor: Clifton Quan, Arcadia, Calif.

[73] Assignee: Hughes Aircraft Company, Los Angeles, Calif.

[21] Appl. No.: 320,030

[22] Filed: Oct. 7, 1994

[51] Int. Cl.$^6$ .......................... G01R 31/02; G01R 19/28
[52] U.S. Cl. .................... 324/72.5; 324/95; 333/246
[58] Field of Search ..................... 324/95, 338, 639, 324/106, 72.5; 333/26, 246; 343/767, 770, 703, 795

Primary Examiner—Ernest F. Karlsen
Assistant Examiner—Russell M. Kobert
Attorney, Agent, or Firm—Leonard A. Alkov; W. K. Denson-Low

[57] ABSTRACT

A microstrip probe that can be inserted into the mouth or radiating portion of a thick flared notch or open ridged waveguide radiator element within an array antenna aperture and coupled to the TEM feed circuit transition of that element. The probe can then be used to extract performance diagnostic data of the circuitry behind the array aperture without removing the aperture itself. The probe bypasses the radiating portion of the array element and the effects of mutual coupling associated with the array. The probe is a printed circuit board whose thickness matches the gap dimension of the flared notch feed circuit transition line at its feed launch point. A coaxial connector at one end provides a connection to a microstrip line formed on the circuit board. The ground plane of the microstrip narrows to transform the microstrip line into a broadside coupled strip transmission line, which runs to the insertion end of the probe. The strips are shorted together at the insertion end. A slot is formed at the insertion end which is one quarter wavelength in length to encourage coupling from the feed circuit into the probe.

17 Claims, 7 Drawing Sheets

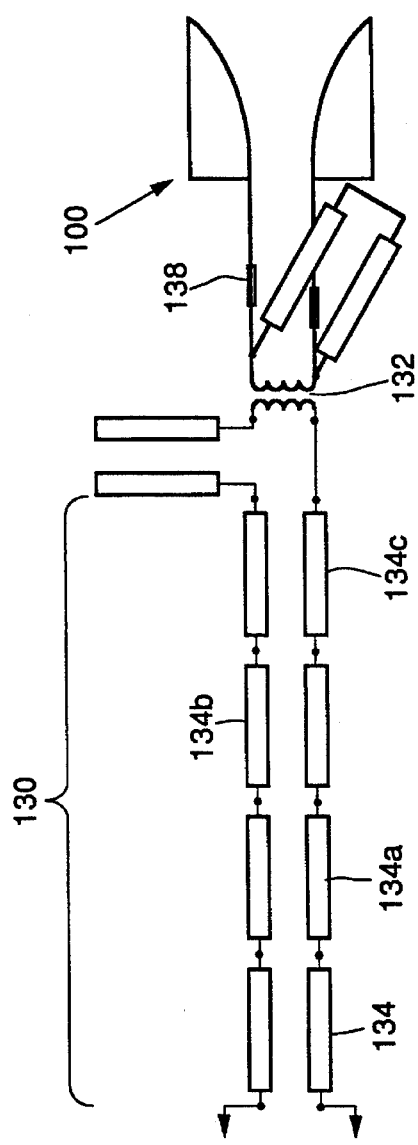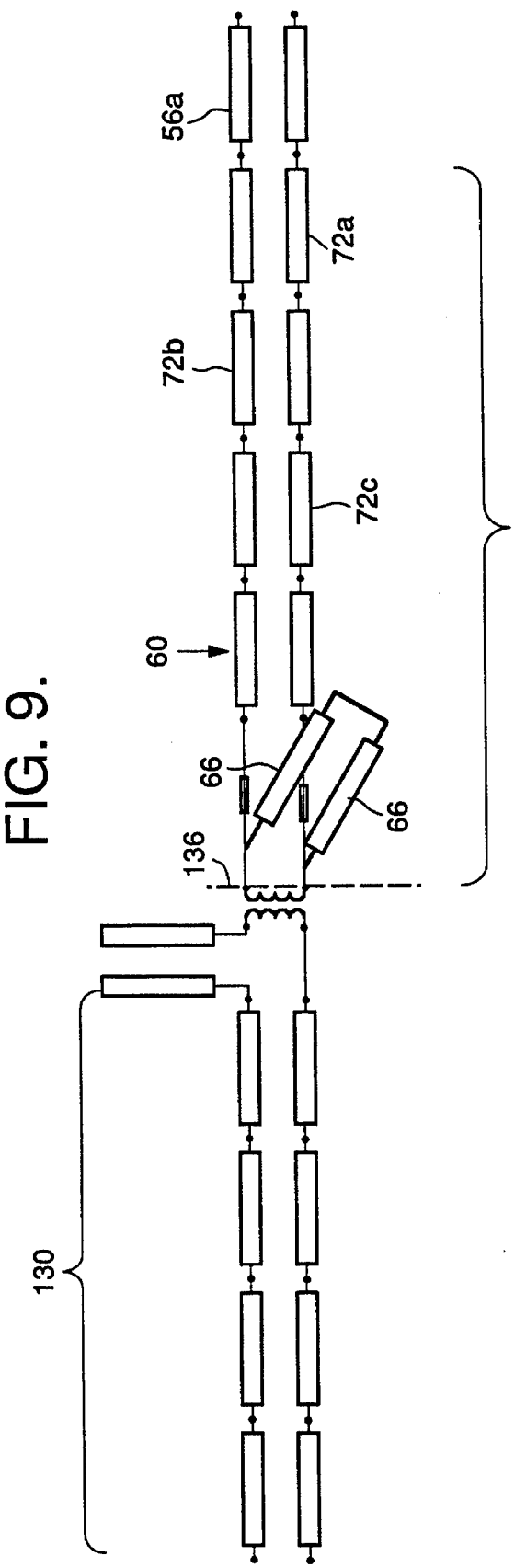

5,502,372

MICROSTRIP DIAGNOSTIC PROBE FOR THICK METAL FLARED NOTCH AND RIDGED WAVEGUIDE RADIATORS

This invention was made with Government support under contract awarded by the Government. The Government has certain rights in this invention.

TECHNICAL FIELD OF THE INVENTION

The present invention relates to the field of active array antennas, and more particularly to a diagnostic probe that can be inserted into the radiating portion of a thick flared notch or open ridged waveguide radiator element to examine the circuit performance.

BACKGROUND OF THE INVENTION

The assembly of active array antennas is very complex because of the number of components used in the array. Performance testing of the assembly antenna is conventionally conducted on the near field range in which a waveguide probe samples RF radiated power at discrete locations across the array. If a single radiating element malfunctions, the near field probe will typically be able to identify its location within the array. However, since the probe is also sampling RF energy radiated from all the remaining array elements at that same location within the array, through a phenomenon known as mutual coupling, the probe cannot provide more detailed information concerning the nature of the failure. Conventionally, to diagnose and correct the failure, it may be necessary to disassemble the antenna, retest all the components along the RF path to the identified failed element, correct the problem, and then reassemble the antenna. Another method of diagnosis is to incorporate built-in-test (BIT) circuitry within the antenna. BIT circuits are typically employed in antennas, but in limited quantities because of constraints on antenna size and weight.

It would therefore be desirable to be able to probe directly into the RF path of the failed radiator in the absence of mutual coupling effects and without disassembling the antenna. For metal flared notch radiators, one can surround the flared notch portion with a rectangular waveguide and sample RF energy from that. The problem with this approach is that such waveguide interconnection tends to be band limited and creates an impedance mismatch at any TEM transitions (such as stripline, microstrip, suspended stripline or coaxial line) within the radiator.

SUMMARY OF THE INVENTION

A test probe is described for testing individual radiating elements and associated feed circuitry in an array of radiating elements without disassembling said array and in the absence of mutual coupling effects involving radiating elements other than the radiating element under test. Each radiating element includes a radiating portion with a gap of a predetermined dimension between radiator conductor elements. Exemplary radiating elements of this type include thick metal flared notch radiating elements and double ridged waveguide radiators. The probe includes a dielectric board having first and second opposed surfaces, and first and second conductor strips formed respectively on the opposing first and second surfaces at an insertion end of the probe. The conductor strips define a broadside coupled strip transmission line.

The probe further includes connector means for providing test connection to the broadside strip transmission line. The probe has a width dimension across the thickness of the dielectric board and first and second conductor strips which is equal to the radiating element radiator gap dimension so that upon insertion of the insertion end into the radiating portion, the first and second strip conductors make contact with the radiator conductor elements and bypass the radiator element.

The radiating element further includes a feed circuit structure extending across the gap. The probe further includes a slot formed at the insertion end and extending along the first and second conductor strips to receive the feed circuit structure as the insertion end is inserted into the radiating portion and without making dc contact between the probe conductor strips and conducting elements of the feed circuit structure.

The connecting means includes a coaxial connector attached to a connector end of the probe, a microstrip conductor defined on the first surface of the dielectric sheet and connected to a coaxial center conductor of the connector, and a microstrip ground plane defined on the second dielectric sheet surface adjacent the connector. The ground plane narrows to transition into the second broadside-coupled conductor strip, and the microstrip conductor transitions into the first broadside-coupled conductor strip.

A method is also described for testing individual radiating elements and circuitry connected to particular tested radiating elements without disassembling the array and in the absence of mutual coupling effects involving radiating elements other than the radiating element under test, using the test probe. The method includes the steps of:

providing a test probe comprising a dielectric board, first and second conductor strips formed on opposing first and second surfaces of the dielectric board at an insertion end of the probe, the conductor strips defining a broadside coupled strip transmission line, connector means for connection to the broadside strip transmission line, the probe having a width dimension across the dielectric board and the first and second conductor strips which is equal to the gap dimension;

inserting the insertion end of the test probe into said radiating portion so that the first and second strip conductors make contact with the radiator conductor elements and bypass the radiator element; and performing electrical tests via the probe connector means.

BRIEF DESCRIPTION OF THE DRAWING

These and other features and advantages of the present invention will become more apparent from the following detailed description of an exemplary embodiment thereof, as illustrated in the accompanying drawings, in which:

FIG. 8 is a schematic diagram of the stripline feed circuit coupling into the flared notch radiator.

FIG. 9 is a schematic diagram of the probe connection to the flared notch radiator feed circuit.

DETAILED DESCRIPTION OF THE PREFERRED EMBODIMENT

Figure 1:
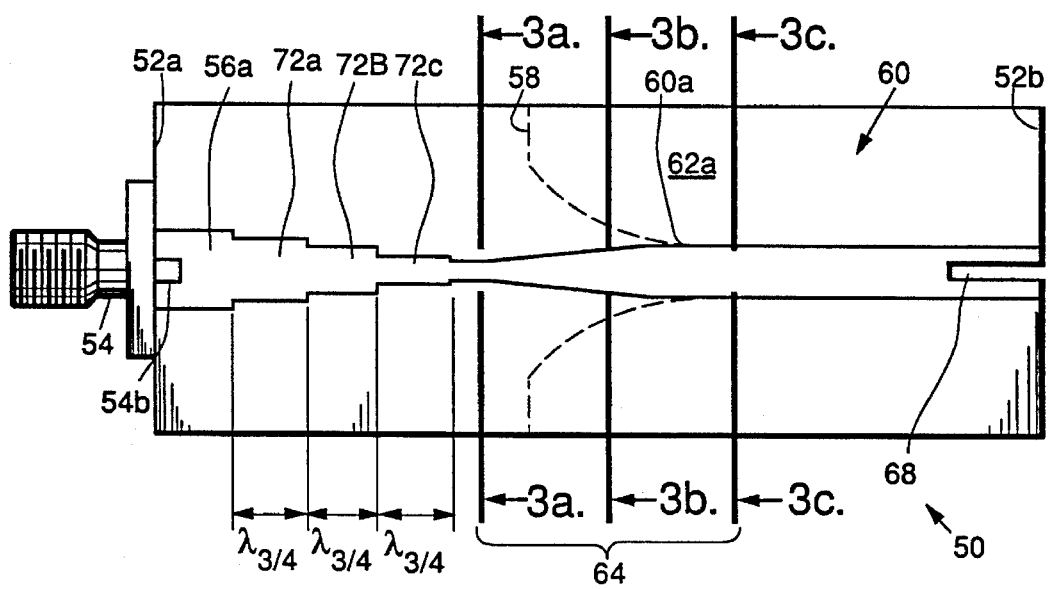
FIG. 1 is a top view of a microstrip probe in accordance with the invention.
Figure 2:
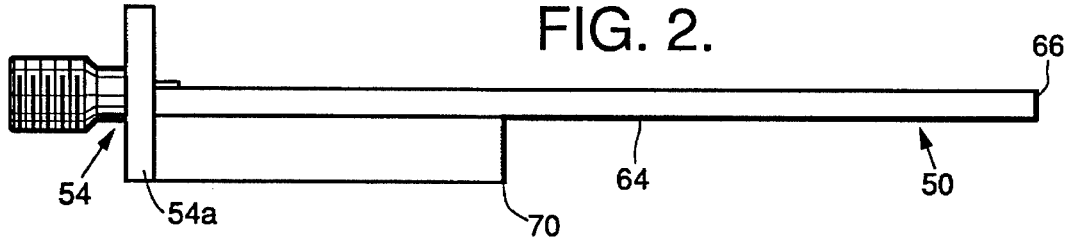
FIG. 2 is a side view of the probe of FIG. 1.

The invention is a microstrip probe that can be inserted into the "mouth" or radiating portion of a thick flared notch radiating element or open ridged waveguide radiator element within the antenna aperture and coupled to the transverse electromagnetic (TEM) transition of that element. This probe can then be used to extract performance diagnostic data of the circuitry behind the aperture without removing the aperture itself, i.e., without disassembling the antenna, with all the radiating elements being first removed. The probe bypasses the radiating portion of the antenna array element and the mutual coupling effects associated with the aperture. Since the probe comprises a TEM transmission line (TRL), the invention will couple directly to the TEM portion of the radiator feed transition circuit and the circuities beyond that transition.

In a preferred embodiment, shown in FIGS. 1-4, an exemplary probe 50 in accordance with the invention comprises a printed circuit board 52 whose thickness matches the gap dimension W (FIG. 5) of the flared notch or ridged waveguide slotline transition line at its feed launch point. A coaxial connector 54 connects to a microstrip TEM TRL 56 at the coaxial connector end 52A of the circuit board 52. The microstrip TRL 56 is defined by a microstrip conductor 56A defined on a first surface 62A of the circuit board 52, and a ground plane conductor layer pattern 58 defined on the opposed second surface 62A of the circuit board. A metal support block 70 is secured to the ground plane pattern 58 and to the connector 54 ground plane 54A. The block provides a structure to which the ground plane 54A can be secured. The center conductor 54B of the coaxial connector is connected to the microstrip conductor 56A.

The ground plane layer pattern 58 of the microstrip line 56 narrows at an intermediate region 64 of the circuit board 52 to transform the microstrip TRL 56 into broadside coupled strip TRL 60, running from the intermediate region 64 to the insertion end 52B of the probe. The resulting broadside coupled strip TRL is impedance matched to the impedance of the radiator feed circuit impedance using either quarter wave transformers, or continuously tapered line widths as shown in FIG. 1. The broadside coupled strip TRL 60 is defined by the first surface conductor strip 60A and second surface conductor strip 60B. Microstrip TRL conductor 56A transitions into the first surface conductor strip 60A. The microstrip ground plane layer pattern 58 transitions into second surface conductor strip 60B. Both conductor strips are connected to each other at insertion end 52B with a short circuit wrap-around conductor 66, as shown more particularly in FIG. 4.

The microstrip TRL conductor 56A is stepped in its width from the connector end 52A of the board to the intermediate region 64 of the board, to provide impedance transformations from the characteristic impedance of the coaxial line, 50 ohms, to the impedance of the broadside coupled strip TRL 60 at the intermediate region. In this exemplary embodiment there are three stages 72A, 72B and 72C of impedance transformation, each having a length equal to one quarter of the wavelength $\lambda_g$, to transform the characteristic impedance of the microstrip TRL 56 from 50 ohms to $Z_f$, where $\lambda_g$ is the propagation wavelength and $Z_f$ is the image impedance seen at the point at which the probe couples to the radiator transition.

Figure 3A:
FIGS. 3A–3C are respective cross-sectional views of the probe of FIG. 1, taken along respective lines 3A—3A, 3B—3B and 3C—3C of FIG. 1.
Figure 3B:
Figure 3C:
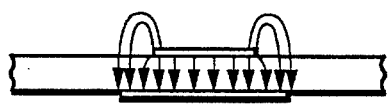
Figure 4:
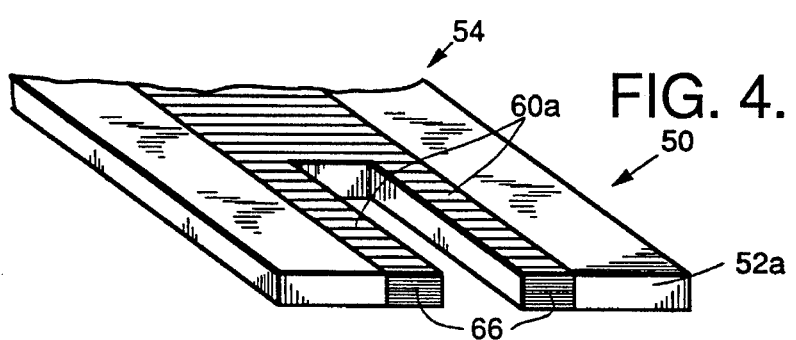
FIG. 4 is a partial isometric view of a portion of the probe of FIG. 1, showing the wrap-around short circuit at the insertion end.

FIGS. 3A-3C illustrate the electric field configurations at various cross-sectional planes along the extent of the probe circuit board, indicated by lines 3A—3A, 3B—3B and 3C—3C shown in FIG. 1. FIG. 3A shows the microstrip TRL field configuration. FIG. 3B shows the field configuration with a finite ground plane, i.e., with the narrowed ground plane pattern 58. FIG. 3C shows the field configuration of the broadside coupled strip TRL 60. These figures indicate the matching of field configurations achieved by the region of the narrowing ground plane pattern 58.

Figure 5:
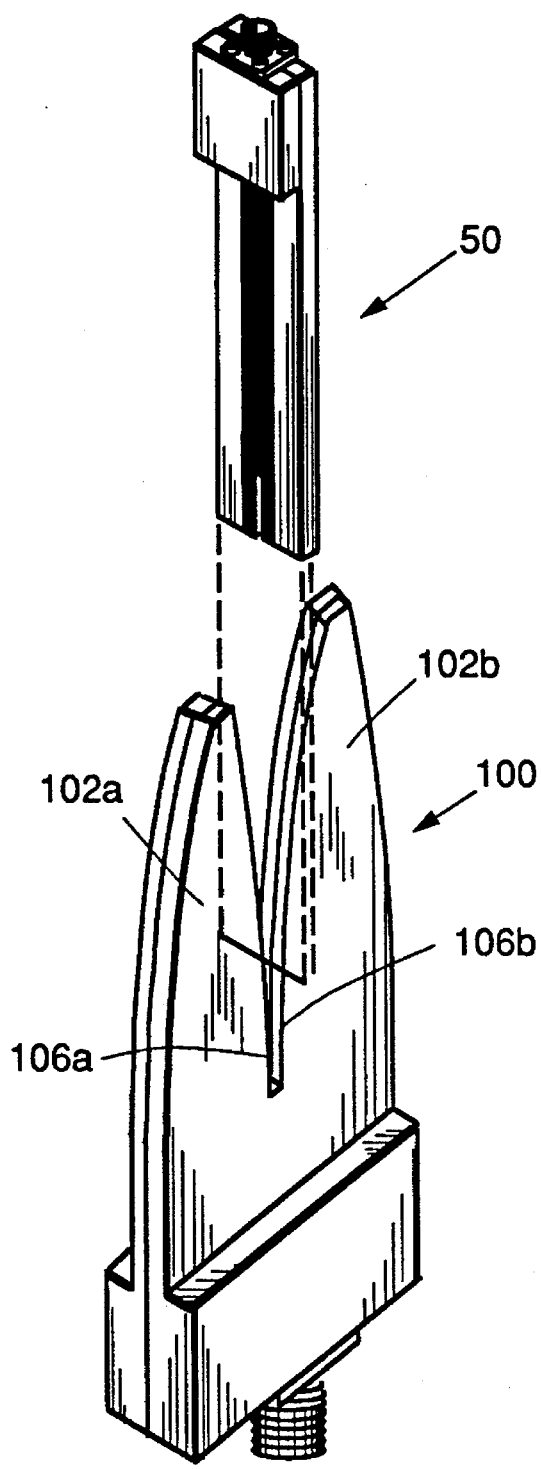
FIG. 5 illustrates in exploded view the insertion of the probe of FIG. 1 into the flared notch of a flared notch radiator in accordance with this invention.
Figure 6:
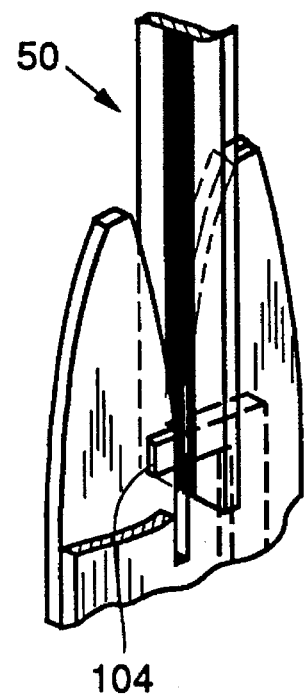
FIG. 6 shows the probe of FIG. 1 inserted into the flared notch of the flared notch radiator of FIG. 5.
Figure 7:
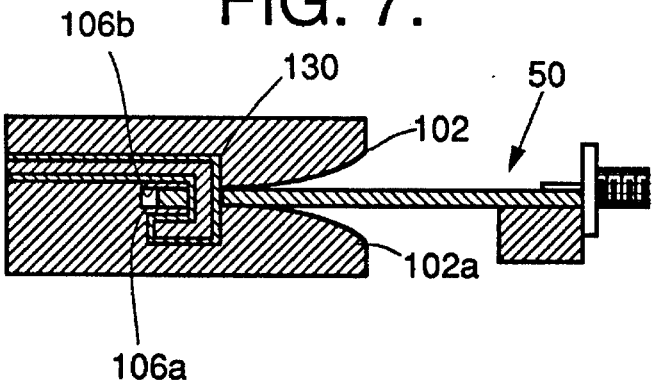
FIG. 7 is a cross-sectional view of the flared notch radiator with the probe inserted in place.

The insertion end 52B of the broadside coupled strip TRL 60 is slotted along the center of the strip width. This slot 68 is made wide enough to permit the feed transition circuit of the radiator element to be received within the probe circuit board without making dc contact between the feed transition circuit and the probe. This is illustrated in FIGS. 5–7, which illustrate a thick metal flared notch radiator 100. The radiator 100 is fed by a stripline TEM feed circuit 130, as shown in FIG. 6, wherein one portion of flare 102A is broken away to reveal the stripline feed circuit 130. The feed circuit 130 excites the radiator slotline comprising slotline inner walls 106A and 106B. The probe 50 is inserted transversely to the plane defined by the flares 102A and 102B of the radiator. The length L of the slot 68 is designed to be a quarter wavelength of the center frequency of operation within the TRL of the probe circuit board to encourage coupling from the radiator feed circuit 130 into the probe 50.

Because the thickness T of the probe circuit board 52 matches that of the radiating element slotline gap width W, the conductors 60A and 60B on the board 52 will make dc contact to the thick slotline inner walls 106A and 106B of the radiating element. The nature of this contact ensure proper interconnection from the flared notch feed circuit 130 into the probe 50, bypassing the flared notched radiator.

FIG. 7 is a cross-sectional view of the thick metal flared radiator 100 and its associated TEM transition feed circuit 130, with probe 50 inserted in place. In this example, the TEM circuit 130 is in suspended substrate stripline.

FIG. 8 is a schematic of the radiator feed circuit 130. The ideal transformer 132 is used to model the waveguide mode conversion as the RF signal converts from the TEM transmission line mode in the stripline feed circuit to the transverse electric (TE) transmission line mode in the radiator. The feed circuit 130 includes three one-quarter wavelength stages 134A, 134B and 134C of impedance transformation to transform from 50 ohm TRL to the impedance of the slotline 138.

FIG. 9 shows a schematic of the probe 50 coupling directly into the feed circuit 130 and bypassing the radiator transmission line 138 and ideal transformer 132. Line 136 indicates the interconnect plane.

Figure 10:
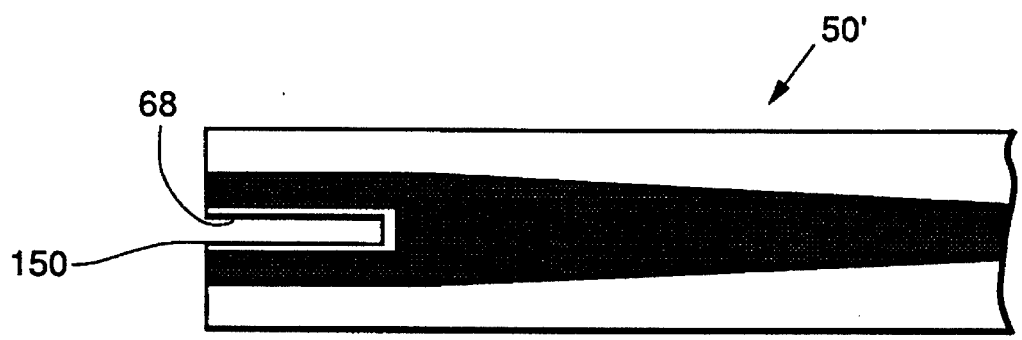
FIG. 10 is a top view of a portion of a first alternate embodiment of a probe in accordance with the invention.

FIG. 10 shows a portion of an alternate embodiment of a probe 50', similar to probe 50 except that a narrow strip of conductor material 150 is removed from around the edge of the slot 68 to prevent short circuiting the stripline feed transition to the slotline radiator.

Figure 11:
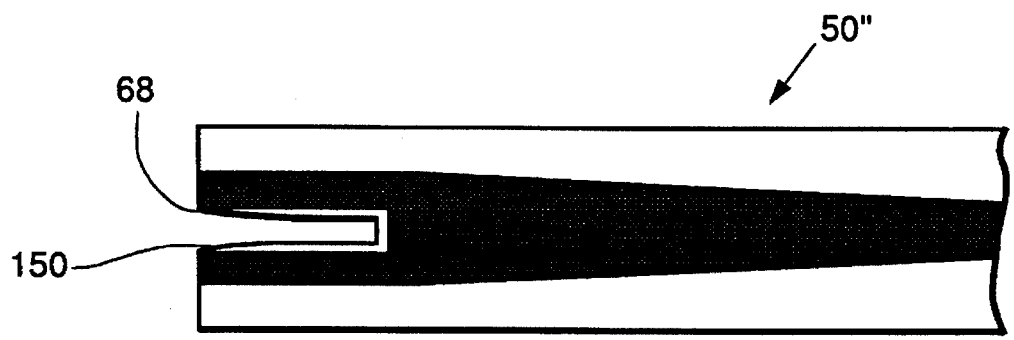
FIG. 11 is a top view of a portion of a second alternate embodiment of a probe in accordance with the invention.

FIG. 11 shows a portion of a second alternate embodiment of a probe 50", similar to probe 50 except that the slot 68 is flared outwardly to provide a self-aligning function to facilitate insertion connection to the radiator feed circuit.

Figure 12:
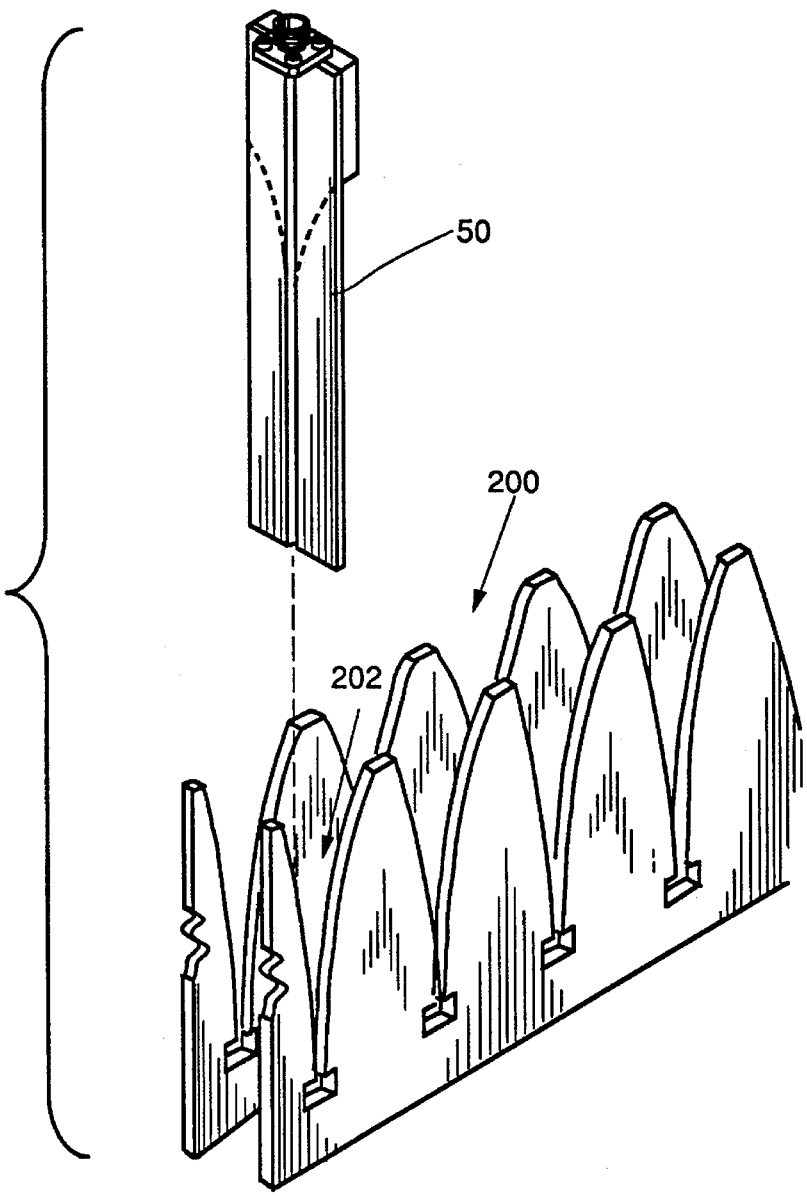
FIG. 12 is an isometric view illustrating a probe to be inserted into a flared notch radiating element of a flared notch radiating array.

FIG. 12 illustrates use of the probe 50 with an array 200 of flared notch radiating elements 202. Upon insertion of the probe 50 into the mouth of a particular flared notch radiator comprising the array 200, the probe bypasses the radiating portion of the array element 202 and the effects of mutual coupling associated with the array aperture.

Figure 13:
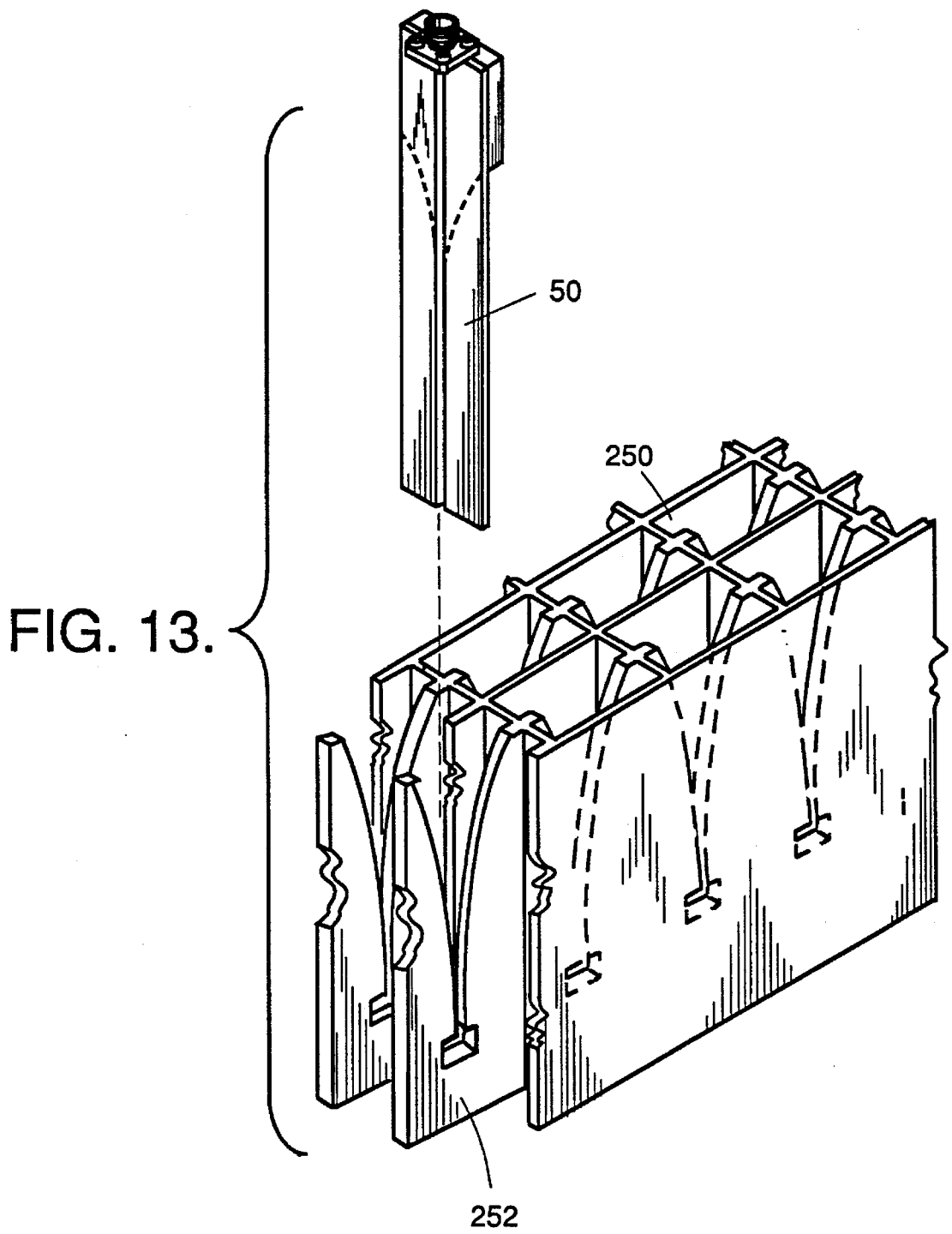
FIG. 13 is an isometric view illustrating a probe to be inserted into a double ridged waveguide array for diagnostic testing.
Figure 14:
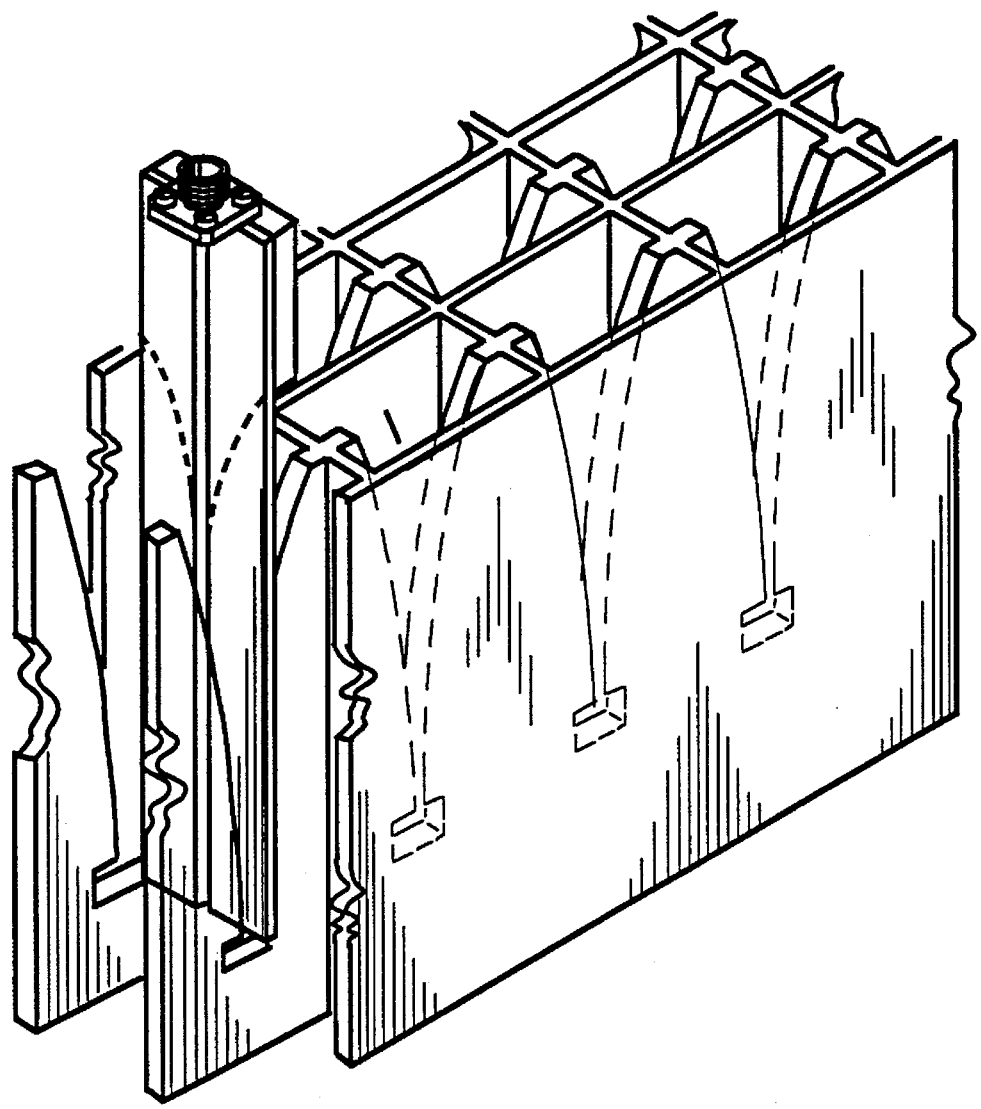
FIG. 14 illustrates the probe of FIG. 13 in the inserted position in the waveguide array.

FIGS. 13 and 14 illustrate how the probe can be inserted into an array 250 of double ridged waveguide radiating elements 252 for diagnostic RF testing. FIG. 13 shows the probe 50 poised above the mouth of a particular double ridged waveguide radiating element 252. FIG. 14 shows the probe in the inserted position. Here again, the probe in the inserted position makes contact with the feed circuit comprising the element 252, and bypasses the radiator portion and the mutual coupling effects associated with the array 250.

A method is also described for testing individual radiating elements and circuitry connected to particular tested radiating elements without disassembling the array and in the absence of mutual coupling effects involving radiating elements other than the radiating element under test, using the test probe. The method includes the steps of:

providing a test probe comprising a dielectric board, first and second conductor strips formed on opposing first and second surfaces of the dielectric board at an insertion end of the probe, the conductor strips defining a broadside coupled strip transmission line, connector means for connection to the broadside strip transmission line, the probe having a width dimension across the dielectric board and the first and second conductor strips which is equal to the gap dimension;

inserting the insertion end of the test probe into said radiating portion so that the first and second strip conductors make contact with the radiator conductor elements and bypass the radiator element; and performing electrical tests via the probe connector means.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. In an antenna including an array of radiating elements, a method for testing individual radiating elements and circuitry connected to particular tested radiating elements without disassembling said array and in the absence of mutual coupling effects involving radiating elements other than the radiating element under test, each radiating element including a radiating portion with a gap of a predetermined dimension between radiator conductor elements, the method comprising the following steps:

providing a test probe comprising a dielectric board having a thickness, first and second conductor strips formed on opposing first and second surfaces of said dielectric board at an insertion end of said probe, said conductor strips defining a broadside coupled strip transmission line, connector means for connection to said broadside strip transmission line, said probe having a width dimension across said thickness of said dielectric board and said first and second conductor strips which is equal to said gap dimension;

inserting said insertion end of said test probe into said radiating portion so that said first and second strip conductors make contact with said radiator conductor elements and bypass said radiator element; and performing electrical tests via said probe connector means.

2. The method of claim 1 wherein said radiating element further includes a feed circuit structure extending across said gap, and said probe further includes a slot formed at said insertion end to receive said feed circuit structure as said insertion end is inserted into said radiating portion and without making dc contact between said probe conductor strips and conducting elements of said feed circuit structure.

3. The method of claim 1 wherein said connecting means includes a coaxial connector attached to a connector end of said probe, a microstrip conductor defined on said first surface and connected to a coaxial center conductor of said connector, and a microstrip ground plane defined on said second surface adjacent said connector.

4. The method of claim 3 wherein said ground plane narrows to transition into said second broadside-coupled conductor strip, and said microstrip conductor transitions into said first broadside-coupled conductor strip.

5. The method of claim 1 wherein said radiating elements are thick metal flared notch radiating elements.

6. The method of claim 1 wherein said radiating elements are ridged waveguide radiators.

7. A test probe for testing individual radiating elements and associated feed circuitry in an array of radiating elements without disassembling said array and in the absence of mutual coupling effects involving radiating elements other than the radiating element under test, each radiating element including a radiating portion with a gap of a predetermined dimension between radiator conductor elements, the probe comprising:

a dielectric board with a thickness and having first and second opposed surfaces;

first and second conductor strips formed respectively on said opposing first and second surfaces of said dielectric board at an insertion end of said probe, said conductor strips defining a broadside coupled strip transmission line;

connector means for connection to said broadside strip transmission line;

said probe having a width dimension across said thickness of said dielectric board and said first and second conductor strips which is equal to said gap dimension so that upon insertion of said insertion end into said radiating portion said first and second strip conductors make contact with said radiator conductor elements and bypass said radiator element.

8. The probe of claim 7 wherein said radiating element further includes a feed circuit structure extending across said gap, and said probe further includes a slot formed at said insertion end and extending along the first and second conductor strips to receive said feed circuit structure as said insertion end is inserted into said radiating portion and without making dc contact between said probe conductor strips and conducting elements of said feed circuit structure.

9. The probe of claim 8 wherein a narrow strip of conductive material is relieved about the periphery of said slot on said first and second surfaces, to prevent short circuiting of said feed circuit to said slotline radiator.

10. The probe of claim 8 wherein said slot is tapered outwardly at said insertion end of said probe to facilitate insertion connection to said radiator portion.

11. The probe of claim 8 wherein said slot has a length equivalent to one-quarter wavelength at a center operating frequency.

12. The probe of claim 7 wherein said connecting means includes a coaxial connector attached to a connector end of said probe, a microstrip conductor defined on said first surface and connected to a coaxial center conductor of said connector, and a microstrip ground plane defined on said second surface adjacent said connector.

13. The probe of claim 12 wherein said ground plane narrows to transition into said second broadside-coupled conductor strip, and said microstrip conductor transitions into said first broadside-coupled conductor strip.

14. The probe of claim 13 wherein said microstrip conductor is stepped in width from said connector end to said intermediate region to provide impedance transformation from the characteristic impedance of said coaxial line to the impedance of said broadside coupled strip line.

15. The probe of claim 7 wherein said radiating elements are thick metal flared notch radiating elements.

16. The probe of claim 7 wherein said radiating elements are ridged waveguide radiators.

17. The probe of claim 7 further including a shorting conductor connecting ends of said conductor strips at said probe insertion end.

\* \* \* \* \*